(12) United States Patent
Tseng et al.

(10) Patent No.: US 9,470,826 B2
(45) Date of Patent: Oct. 18, 2016

(54) COLOR FILTER AND DISPLAY PANEL USING SAME

(71) Applicant: Ye Xin Technology Consulting Co., Ltd., Hsinchu (TW)

(72) Inventors: Shih-Pin Tseng, Hsinchu (TW); Jung-An Cheng, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/681,855

(22) Filed: Apr. 8, 2015

(65) Prior Publication Data

US 2016/0091641 A1    Mar. 31, 2016

(30) Foreign Application Priority Data

Sep. 30, 2014 (TW) .............................. 103134114 A (51) Int. Cl.
| | |
|---|---|
| H01L 27/00 | (2006.01) |
| H01L 51/00 | (2006.01) |
| G02B 5/20 | (2006.01) |
| H01L 27/32 | (2006.01) |
| H01L 51/52 | (2006.01) |

(52) U.S. Cl.
CPC .............. G02B 5/201 (2013.01); H01L 27/322 (2013.01); H01L 27/3244 (2013.01); H01L 51/5284 (2013.01)

(58) Field of Classification Search
CPC ...... G02B 5/201; G02B 5/206; G02B 5/285; H01L 27/322; H01L 27/156; H01L 27/14647; H01L 51/5284; H01L 51/42; H01L 51/5016
See application file for complete search history.

(56) References Cited

U.S. PATENT DOCUMENTS

| | | | | |
|---|---|---|---|---|
| 7,102,152 B2* | 9/2006 | Chua | ...................... | B82Y 10/00 257/14 |
| 7,134,687 B2* | 11/2006 | Breed | ................... | B60N 2/4885 280/735 |
| 8,269,411 B2* | 9/2012 | Yu | ........................... | B82Y 20/00 257/98 |
| 2003/0184065 A1* | 10/2003 | Breed | ................... | B60N 2/4885 280/735 |
| 2006/0081862 A1* | 4/2006 | Chua | ...................... | B82Y 10/00 257/98 |
| 2008/0278063 A1* | 11/2008 | Cok | ........................ | B82Y 20/00 313/500 |
| 2011/0156575 A1* | 6/2011 | Yu | ........................... | B82Y 20/00 313/503 |
| 2011/0303940 A1* | 12/2011 | Lee | ........................ | H01L 33/54 257/98 |
| 2012/0050632 A1* | 3/2012 | Shih | ....................... | B82Y 20/00 349/42 |
| 2013/0063496 A1* | 3/2013 | Basler | ................. | H04N 13/0404 345/690 |
| 2013/0070443 A1* | 3/2013 | Pan | .......................... | C09K 9/02 362/84 |
| 2015/0286095 A1* | 10/2015 | Wang | ................... | G02B 6/0068 349/42 |
| 2015/0380671 A1* | 12/2015 | Shu | .................... | G02F 1/133617 257/13 |

FOREIGN PATENT DOCUMENTS

| | | |
|---|---|---|
| JP | H08279394 A | 10/1996 |
| JP | 2005243549 A | 9/2005 |
| JP | 2008010298 A | 1/2008 |
| JP | 2009251129 A | 10/2009 |
| TW | 201427893 | 7/2014 |

* cited by examiner

Primary Examiner — Nikolay Yushin
(74) Attorney, Agent, or Firm — Zhigang Ma (57) ABSTRACT

A color filter of display panel for converting dual band white backlight to light with three-primary colors. The color filter includes a plurality of first filtering parts, a plurality of second filtering parts, and a plurality of quantum dot blocks. The first filtering parts have a first primary color and allow light having a first wavelength corresponding to the first primary color to pass therethrough. The second filtering parts have a second primary color and selectively allow light having a second wavelength corresponding to the second primary color to pass therethrough. The quantum dot block converting light having a wavelength smaller than a third wavelength corresponding to a third primary color to light having the second wavelength.

8 Claims, 10 Drawing Sheets

COLOR FILTER AND DISPLAY PANEL USING SAME

CROSS-REFERENCE TO RELATED APPLICATIONS

This application claims priority to Taiwanese Patent Application No. 103134114 filed on Sep. 30, 2014 in the Taiwanese Intellectual Property Office and Taiwanese Patent Application No. 103146679 filed on Dec. 31, 2014 in the Taiwanese Intellectual Property Office, the contents of which are incorporated by reference herein.

FIELD

The disclosure generally relates to color filter and display panel technologies.

BACKGROUND

A color filter usually only lets a light with a specific color through and absorbs the light of the other colors. Thus, a light transmittance of the color filter may be low and a lot of light may be wasted after passing through the color filter.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The present disclosure is described in relation to a color filter used in a display panel.

Figure 1:
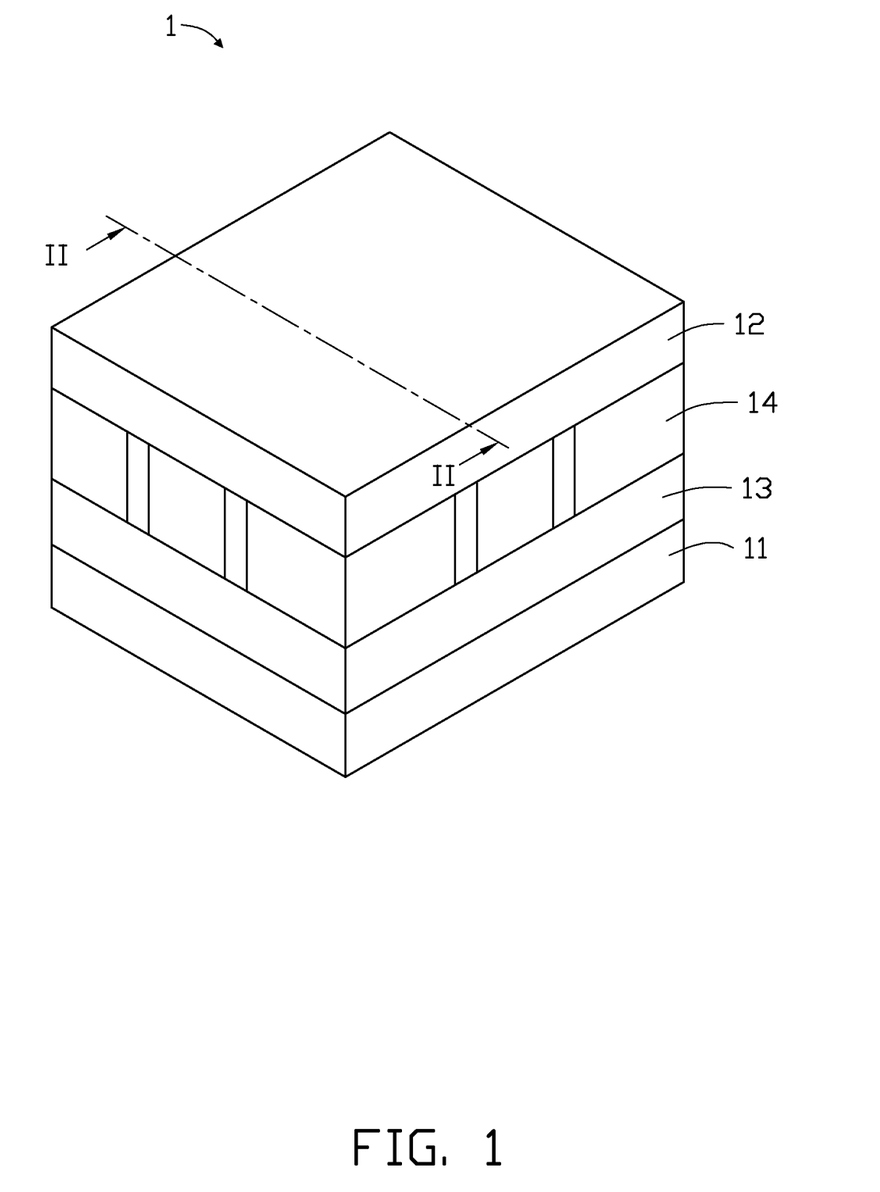
FIG. 1 is an isometric view of a first embodiment of a display panel.
Figure 2:
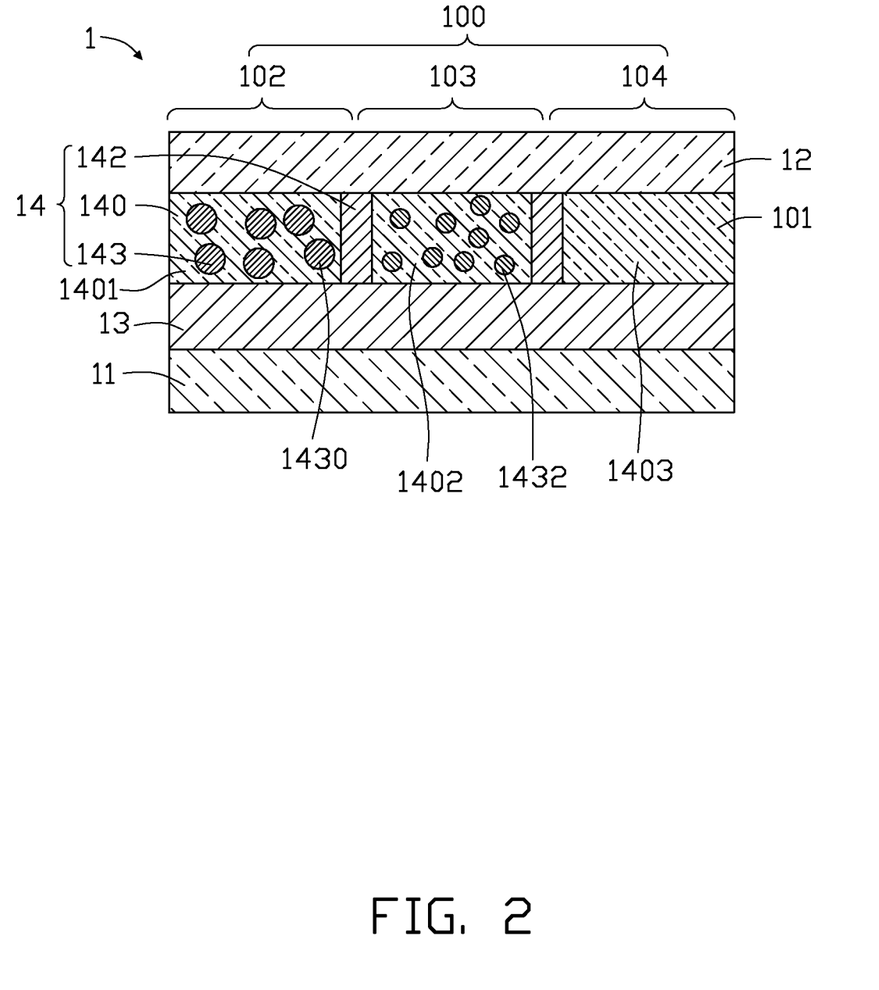
FIG. 2 is a cross-sectional view of the display panel of FIG. 1, taken along line II-II.

FIG. 1 illustrates an isometric view of a first embodiment of a display panel 1. FIG. 2 illustrates a cross-sectional view of the display panel 1 of FIG. 1, taken along line II-II. FIG. 2 illustrates one pixel area 100 for example. The display panel 1 displays a full color image. The display panel 1 can be a liquid crystal display (LCD) panel or an organic light emitting diode (OLED) display panel. In this embodiment, the display panel 1 is an OLED display panel.

The display panel 1 includes a first substrate 11, a second substrate 12 opposite to the first substrate 11, a lighting device 13, and a color filter 14.

The lighting device 13 is formed on the first substrate 11 and configured to emit backlight to illuminate the display panel 1. In this embodiment, the lighting device 13 can be an OLED array substrate. The OLED array substrate includes a number of thin film transistors (not shown) to control a number of OLEDS to emit white backlight.

The color filter 14 is formed on the second substrate 12. The color filter 14 receives the backlight from the lighting device 13 and converts the backlight to light with different colors for displaying a full color image. The color filter 14 defines a number of pixel areas 100. Each pixel area 100 includes a number of sub-pixels 101 for respectively converting the backlight to the light with different colors. In this embodiment, the display panel 1 employs three-primary color lights to display the full color image. The sub-pixels 101 can include a first sub-pixel 102, a second sub-pixel 103, and a third sub-pixel 104. The first sub-pixel 102 emits red light. The second sub-pixel 103 emits green light. The third sub-pixel 104 emits blue light. In the other embodiment, the color filter 14 can be formed on the lighting device 13.

The color filter 14 includes a number of filtering parts 140 with different colors, a number of black matrixes 142, and a number of quantum dot particles 143 formed in the filtering parts 140. The filtering parts 140 with different colors are separated from each other by the black matrixes 142 and respectively correspond to the sub-pixels 101 for respectively converting the backlight to light with different colors. The filtering parts 140 are made of photoresist material and include dye with a color corresponding to the color of converted light. The filtering parts 140 can be formed on the second substrate 12 by a photolithography process, an ink-jet printing process, a microtransfer process, or a silk screen printing process.

The quantum dot particles 143 are made of inorganic nano-materials which can convert the backlight having a wavelength smaller than a wavelength of light with a specific color to the light with the specific color. In this embodiment, the quantum dot particles 143 include a number of red quantum dot particles 1430 and a number of green quantum dot particles 1432. The red quantum dot particles 1430 converts the light having a wavelength smaller than a wavelength of red light to the red light. The green quantum dot particles 1432 converts the light having a wavelength smaller than a wavelength of green light to the green light. In this embodiment, the quantum dot particles 143 are evenly formed in the filtering parts 140. In the other embodiment, a density of the quantum dot particles 143 is varied in different portions of the filtering parts 140. For example, a density of the quantum dot particles 143 near the lighting device 13 is greater than a density of the quantum dot particles 143 away from the lighting device 13.

In this embodiment, the color filter 14 includes a transparent first filtering part 1401 corresponding to the first sub-pixel 102, a green second filtering part 1402 corresponding to the second sub-pixel 103, and a blue third filtering part 1403 corresponding to the third sub-pixel 104. The red quantum dot particles 1430 are formed in the transparent first filtering part 1401. The green quantum dot particles 1432 are formed in the green second filtering part 1402. In at least one embodiment, no quantum dot particles 143 are formed in the blue third filtering part 1403. The color of the first filtering part 1401 corresponding to the first sub-pixel 402 can be red because the light emitted from the first sub-pixel 102 is also red.

The red quantum dot particles 1430 formed in the transparent first filtering part 1401 can convert a blue part and a green part of the white backlight passing through the first sub-pixel 102 to the red light. The green quantum dot particles 1432 formed in the green second filtering part 1402 can convert a blue part of the white backlight passing through the second sub-pixel 103 to the green light. Thus, most of the white backlight can pass through the color filter 14 and be used to display an image. The light transmittance of the color filter 14 is improved.

Figure 3:
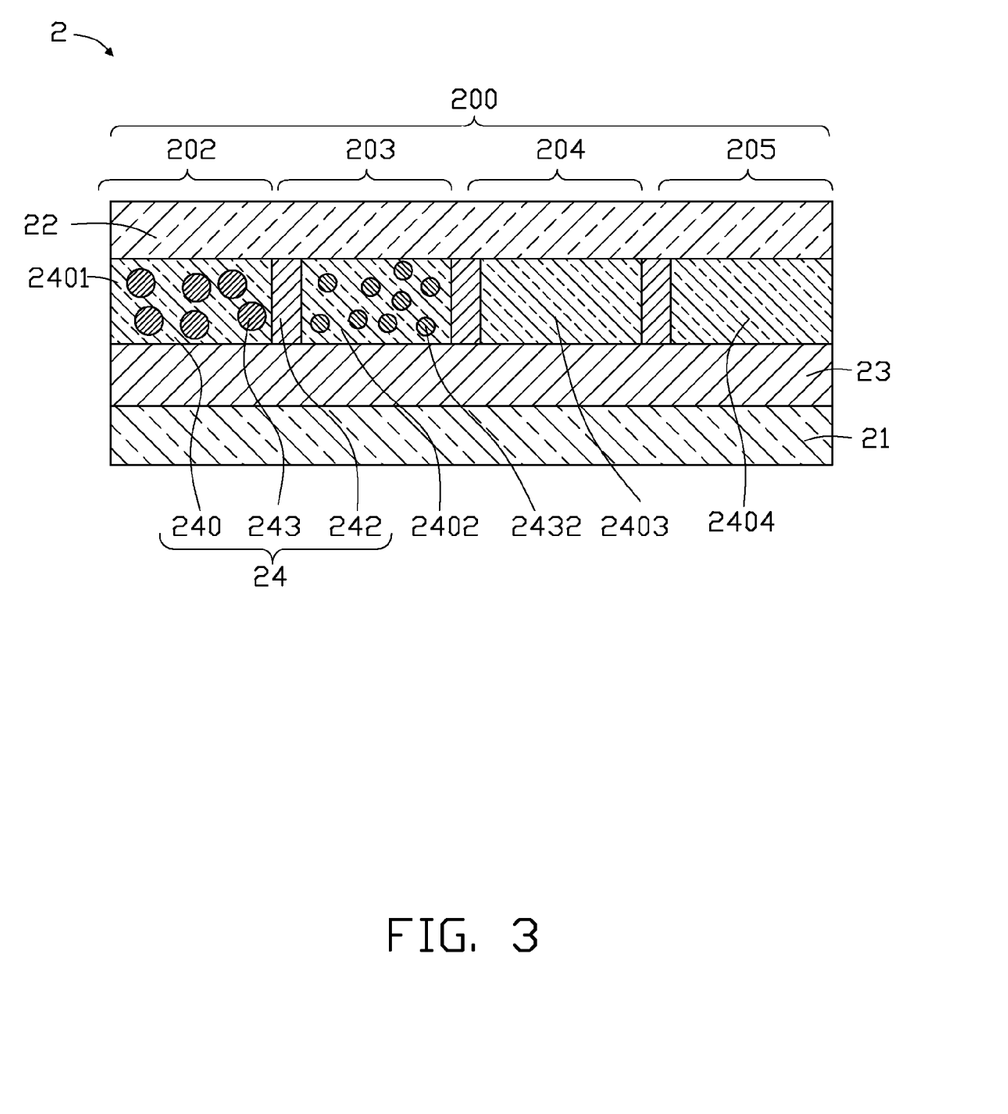
FIG. 3 is a cross-sectional view of a second embodiment of a display panel.

FIG. 3 illustrates a cross-sectional view of a second embodiment of a display panel 2. In this embodiment, the display panel 2 can be an OLED display panel. The display panel 2 includes a first substrate 21, a second substrate 22 opposite to the first substrate 21, a lighting device 23, and a color filter 24.

The lighting device 23 is formed on the first substrate 21 and configured to emit backlight to illuminate the display panel 2. In this embodiment, the lighting device 23 is an OLED array substrate for emitting white backlight.

The color filter 24 is formed on the second substrate 12. The color filter 24 defines a number of pixel areas 200. Each pixel area 200 includes a number of sub-pixels 201 for respectively converting the backlight to the light with different colors. The color filter 24 includes a number of filtering parts 240 with different colors, a number of black matrixes 242, and a number of quantum dot particles 243 formed in the filtering parts 240. The filtering parts 240 with different colors are separated from each other by the black matrixes 242 and respectively correspond to the sub-pixels 201 for respectively converting the backlight to the light with different colors. The color filter 24 receives the backlight from the lighting device 23 and converts the backlight to light with different colors for displaying a full color image.

In this embodiment, each pixel area 200 defines a first sub-pixel 202, a second sub-pixel 203, a third sub-pixel 204, and a fourth sub-pixel 205. The first sub-pixel 202 emits red light. The second sub-pixel 203 emits green light. The third sub-pixel 204 emits blue light. The fourth sub-pixel 205 emits white light to increase a brightness of the pixel area 200. The color filter 24 includes a transparent first filtering part 2401 corresponding to the first sub-pixel 202, a green second filtering part 2402 corresponding to the second sub-pixel 203, a blue third filtering part 2403 corresponding to the third sub-pixel 204, a transparent fourth filtering part 2404 corresponding to the fourth sub-pixel 205, a number of red quantum dot particles 2430 formed in the transparent first filtering part 2401, and a number of green quantum dot particles 2432 formed in the green second filtering part 2402. In at least one embodiment, no quantum dot particles 243 are formed in both the blue third filtering part 2403 and the transparent fourth filtering part 2404. The white backlight passes through the transparent fourth filtering part 2404 without any color conversion. In other embodiments, the color of the first filtering part 2401 corresponding to the first sub-pixel 202 can be red which is the same color with the color of light emitted from the first sub-pixel 202.

Figure 4:
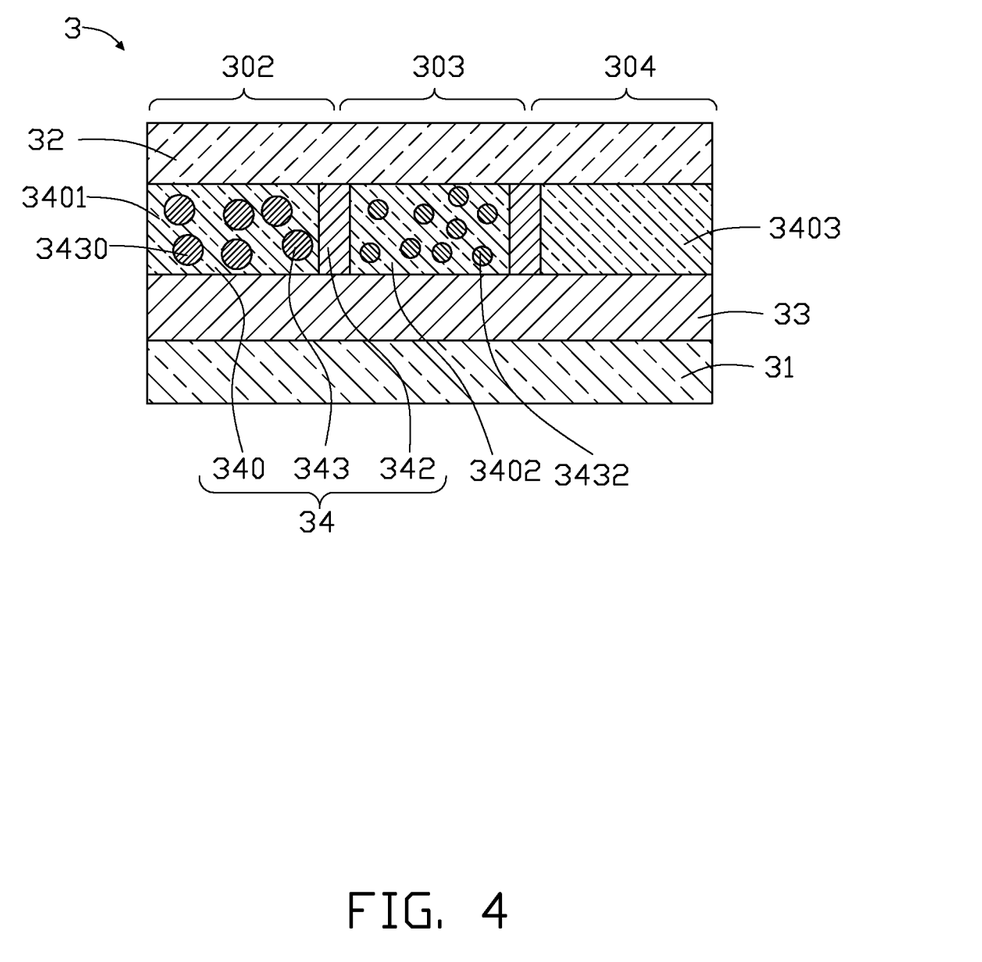
FIG. 4 is a cross-sectional view of a third embodiment of a display panel.

FIG. 4 illustrates a cross-sectional view of a third embodiment of a display panel 3. In this embodiment, the display panel 3 can be an OLED display panel. The display panel 3 includes a first substrate 31, a second substrate 32 opposite to the first substrate 31, a lighting device 33, and a color filter 34.

The lighting device 33 is formed on the first substrate 31 and configured to emit backlight to illuminate the display panel 3. In this embodiment, the lighting device 33 is an OLED array substrate for emitting blue backlight.

The color filter 34 is formed on the second substrate 32. The color filter 34 defines a number of pixel areas 300. Each pixel area 300 includes a number of sub-pixels 301 for respectively converting the backlight to the light with different colors. The color filter 34 includes a number of filtering parts 340 with different colors, a black matrix 342, and a number of quantum dot particles 343 formed in the filtering parts 340. The filtering parts 340 with different colors are divided by the black matrix 342 and respectively correspond to the sub-pixels 301 for respectively converting the backlight to the light with different colors. The color filter 34 receives the backlight from the lighting device 33 and converts the backlight to light with different colors for displaying a full color image.

In this embodiment, each pixel area 300 defines a first sub-pixel 302, a second sub-pixel 303, and a third sub-pixel 304. The first sub-pixel 302 emits red light. The second sub-pixel 303 emits green light. The third sub-pixel 304 emits blue light. The color filter 34 includes a transparent first filtering part 3401 corresponding to the first sub-pixel 302, a transparent second filtering part 3402 corresponding to the second sub-pixel 303, a transparent third filtering part 3403 corresponding to the third sub-pixel 304, a number of red quantum dot particles 3430 formed in the transparent first filtering part 3401, and a number of green quantum dot particles 3432 formed in the transparent second filtering part 3402. In at least one embodiment, no quantum dot particle 343 is formed in the transparent third filtering part 2403. In other embodiments, the color of the first filtering part 3401 corresponding to the first sub-pixel 302 can be red which is the same as the color of light emitting from the first sub-pixel 302. The color of the second filtering part 3402 corresponding to the second sub-pixel 303 can be green which is the same as the color of light emitted from the second sub-pixel 303.

Figure 5:
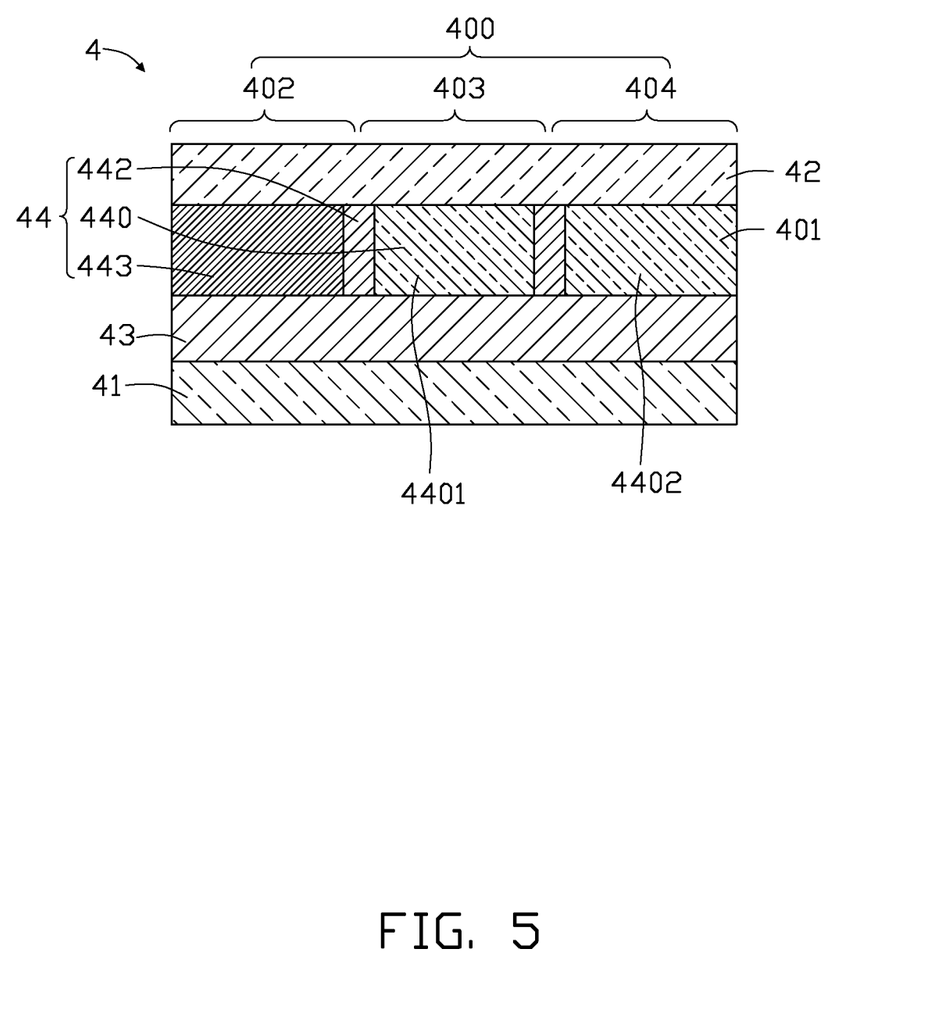
FIG. 5 is a cross-sectional view of a fourth embodiment of a display panel.

FIG. 5 illustrates a cross-sectional view of a fourth embodiment of a display panel 4. FIG. 5 merely illustrates one pixel area 400 for example. In this embodiment, the display panel 4 can be an LCD panel or an OLED display panel. The display panel 4 includes a first substrate 41, a second substrate 42 opposite to the first substrate 41, a lighting device 43, and a color filter 44.

The lighting device 43 is formed on the first substrate 41 and configured to emit backlight to illuminate the display panel 4. In this embodiment, the lighting device 4 is an OLED array substrate for emitting dual band white backlight. The dual band white backlight include blue and green band light and yellow band light. Thus, the white backlight emitting from the lighting device 43 looks like a little green because of lacking red band light.

The color filter 44 is formed on the second substrate 42. The color filter 44 defines a number of pixel areas 400. Each pixel area 400 includes a number of sub-pixels 401 for respectively converting the backlight to the light with different colors. The color filter 44 includes a number of filtering parts 440 with different colors, a number of black matrixes 442, and a number of quantum dot blocks 443. The filtering parts 440 with different colors are separated from each other by the black matrixes 442 and respectively correspond to the sub-pixels 401 for respectively converting the backlight to the light with different colors. The color filter 44 receives the backlight from the lighting device 43 and converts the backlight to light with different colors for displaying a full color image. In this embodiment, the display panel 4 employs three-primary color lights to display the full color image. The sub-pixels 401 can include a first sub-pixel 402, a second sub-pixel 403, and a third sub-pixel 404. The first sub-pixel 402 emits red light. The second sub-pixel 403 emits green light. The third sub-pixel 404 emits blue light. In the other embodiment, the color filter 44 can be formed on the lighting device 43.

The filtering parts 440 are made of photoresist material and include dye with a color corresponding to the color of converted light. The filtering parts 440 can be formed on the second substrate 42 by a photolithography process, an ink-jet printing process, a microtransfer process, or a silk screen printing process.

The quantum dot blocks 443 are made of inorganic nano-materials which can convert the backlight having a wavelength smaller than a wavelength of light with a specific color to the light with the specific color. In this embodiment, the quantum dot blocks 443 can be red quantum dot blocks. The red quantum dot blocks convert the light having a wavelength smaller than a wavelength of red light to the red light. In this embodiment, the red quantum dot blocks convert a part of green light of the dual band white backlight to red light to compensate the lack of the red light, thereby expanding the color gamut of the backlight of the display panel 4.

In this embodiment, the color filter 44 includes the red quantum dot block corresponding to the first sub-pixel 402, a green first filtering part 4401 corresponding to the second sub-pixel 403, and a blue second filtering part 4402 corresponding to the third sub-pixel 404. The red quantum dot block is located corresponding to the first sub-pixel 402.

In a manufacturing process of the color filter 44, the black matrixes 442 can be formed on the second substrate 42 or on the lighting device 43 first. The first filtering part 4401 and the second filtering part 4402 can be respectively formed in a space between two corresponding black matrixes 442 by a photo process. Then, each of the red quantum dot blocks can be located at a space between two corresponding black matrixes 442, by using a coating process or a silk screen printing process, for example. Correspondingly, the second substrate 42 and the black matrixes 442 can be made of materials having strong hydrophobicity or materials having fluorinated structure, thereby preventing the red quantum dot blocks from being adhered to the surfaces of the second substrate 42 and the black matrixes 442.

As described above, the color filter 44 of the display panel 4 has the quantum dot blocks 443 to convert a part of light of the backlight emitting from the lighting device 43 to the light having the specific color, thereby expanding the color gamut of the display panel 4.

Figure 6:
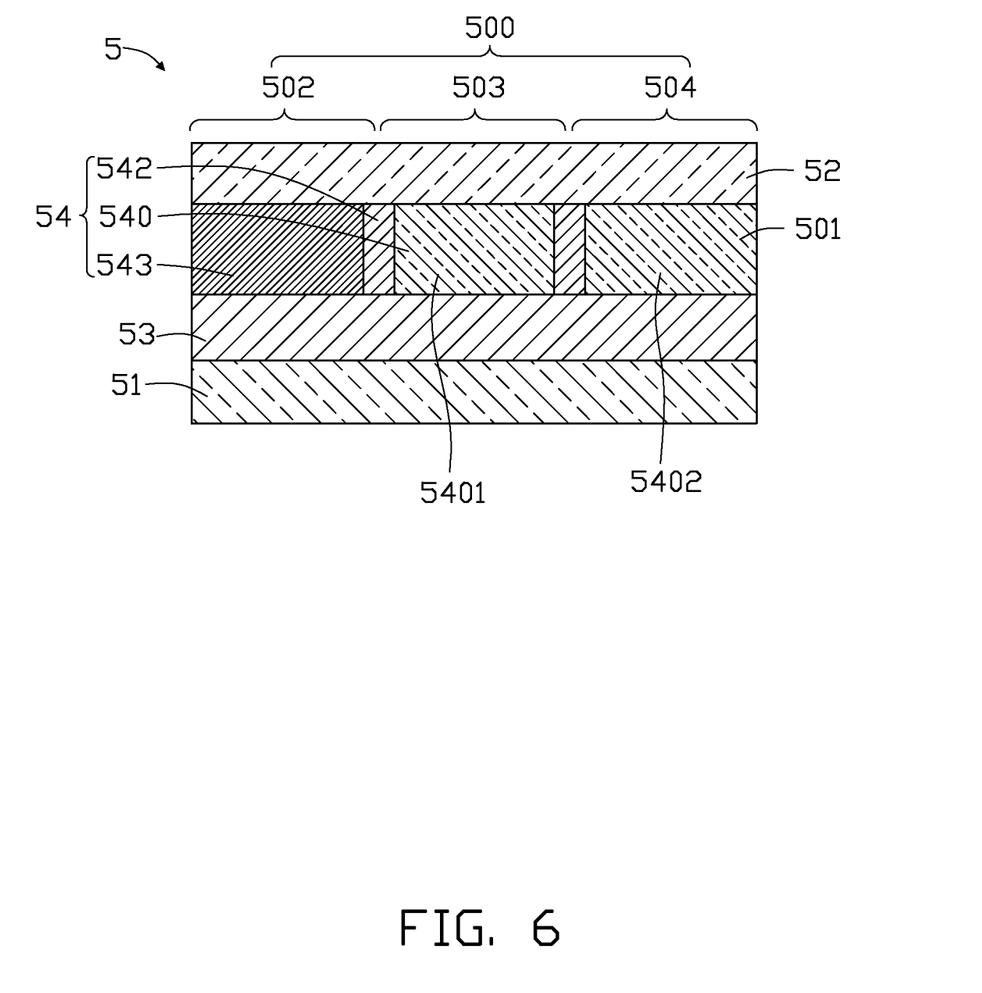
FIG. 6 is a cross-sectional view of a fifth embodiment of a display panel.

FIG. 6 illustrates a cross-sectional view of a fifth embodiment of a display panel 5. FIG. 6 merely illustrates one pixel area 500 for example. In this embodiment, the display panel 5 can be an LCD panel or an OLED display panel. The display panel 5 includes a first substrate 51, a second substrate 52 opposite to the first substrate 51, a lighting device 53, and a color filter 54.

The lighting device 53 is formed on the first substrate 51 and configured to emit backlight to illuminate the display panel 5. In this embodiment, the lighting device 53 is an OLED array substrate for emitting dual band white backlight. The dual band white backlight include blue band light and red band light. Thus, the white backlight emitting from the lighting device 43 looks like a little pink because of lacking green band light.

The color filter 54 is formed on the second substrate 52. The color filter 54 defines a number of pixel areas 500. Each pixel area 500 includes a number of sub-pixels 501 for respectively converting the backlight to the light with different colors. The color filter 54 includes a number of filtering parts 540 with different colors, a number of black matrixes 542, and a number of quantum dot blocks 543. The filtering parts 540 with different colors are separated from each other by the black matrixes 542 and respectively correspond to the sub-pixels 501 for respectively converting the backlight to the light with different colors. The color filter 54 receives the backlight from the lighting device 53 and converts the backlight to light with different colors for displaying a full color image. In this embodiment, the display panel 5 employs three-primary color lights to display the full color image. The sub-pixels 501 can include a first sub-pixel 502, a second sub-pixel 503, and a third sub-pixel 504. The first sub-pixel 502 emits green light. The second sub-pixel 503 emits red light. The third sub-pixel 504 emits blue light. In the other embodiment, the color filter 54 can be formed on the lighting device 53.

The filtering parts 540 are made of photoresist material and include dye with a color corresponding to the color of converted light. The filtering parts 540 can be formed on the second substrate 52 by a photolithography process, an ink-jet printing process, a microtransfer process, or a silk screen printing process.

The quantum dot blocks 543 are made of inorganic nano-materials which can convert the backlight having a wavelength smaller than a wavelength of light with a specific color to the light with the specific color. In this embodiment, the quantum dot blocks 543 can be green quantum dot blocks. The green quantum dot blocks convert the light having a wavelength smaller than a wavelength of red light to the red light. In this embodiment, the green quantum dot modules converts a part of blue light of the dual band white backlight to green light to compensate the lack of the green light, thereby expanding the color gamut of the backlight of the display panel 5.

In this embodiment, the color filter 54 includes the green quantum dot blocks corresponding to the first sub-pixel 502, a red first filtering part 5401 corresponding to the second sub-pixel 503, and a blue second filtering part 5402 corresponding to the third sub-pixel 504. The green quantum dot block is located corresponding to the first sub-pixel 502.

In a manufacturing process of the color filter 54, the black matrixes 542 can be first formed on the second substrate 52 or on the lighting device 53. The first filtering part 5401 and the second filtering part 5402 can be respectively formed in a space between two corresponding black matrixes 542 by a photo process. Then, each of the green quantum dot blocks can be located at a space between two corresponding black matrixes 542, by using a coating process or a silk screen printing process, for example. Correspondingly, the second substrate 52 and the black matrixes 542 can be made of materials having strong hydrophobicity or materials having fluorinated structure, thereby preventing the green quantum dot blocks from being adhered to the surfaces of the second substrate 52 and the black matrixes 542.

As described above, the color filter 54 of the display panel 5 has the quantum dot blocks 543 to convert a part of light of the backlight emitting from the lighting device 53 to the light having the specific color, thereby expanding the color gamut of the display panel 5.

Figure 7:
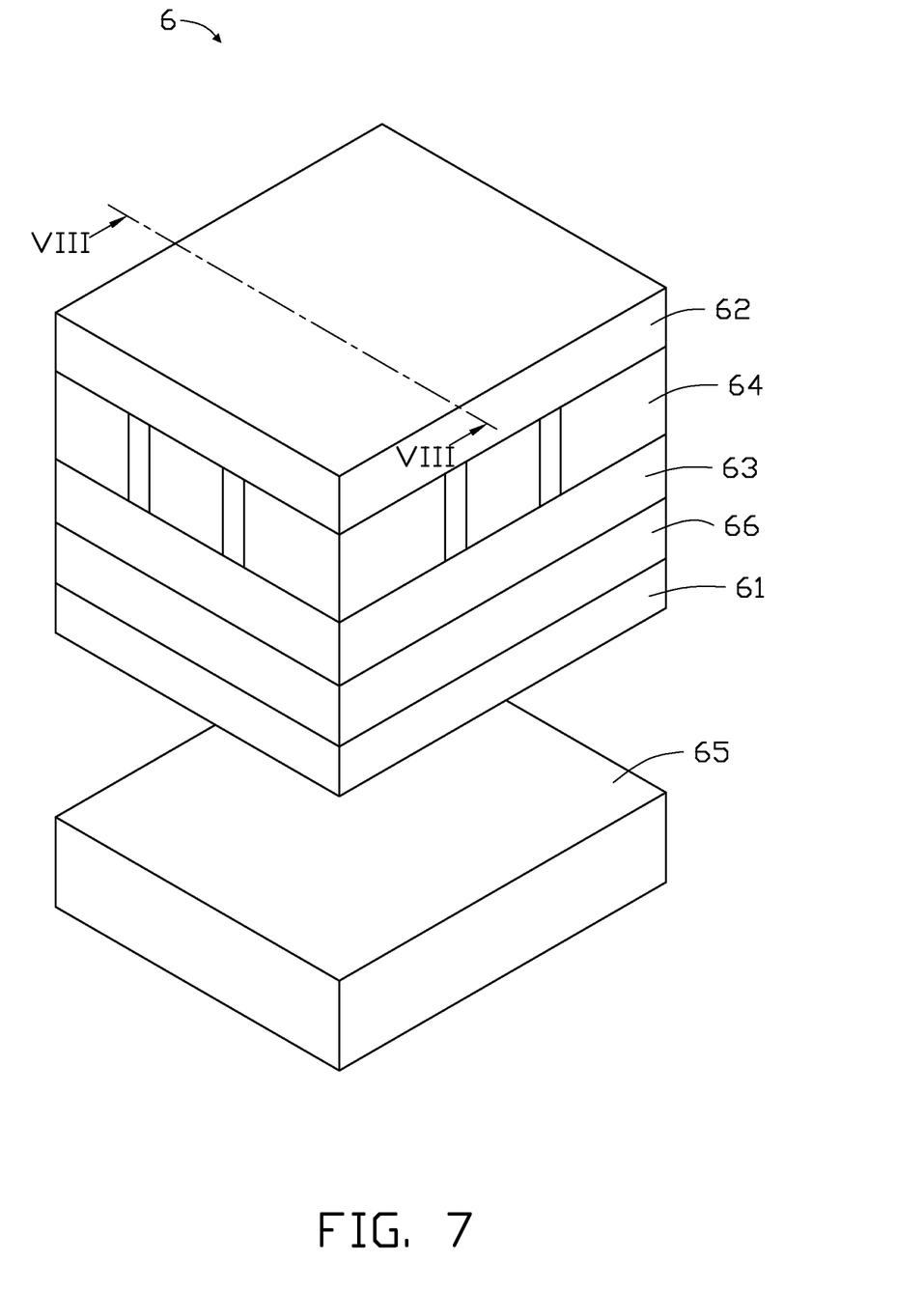
FIG. 7 is an isometric view of a sixth embodiment of a display panel.
Figure 8:
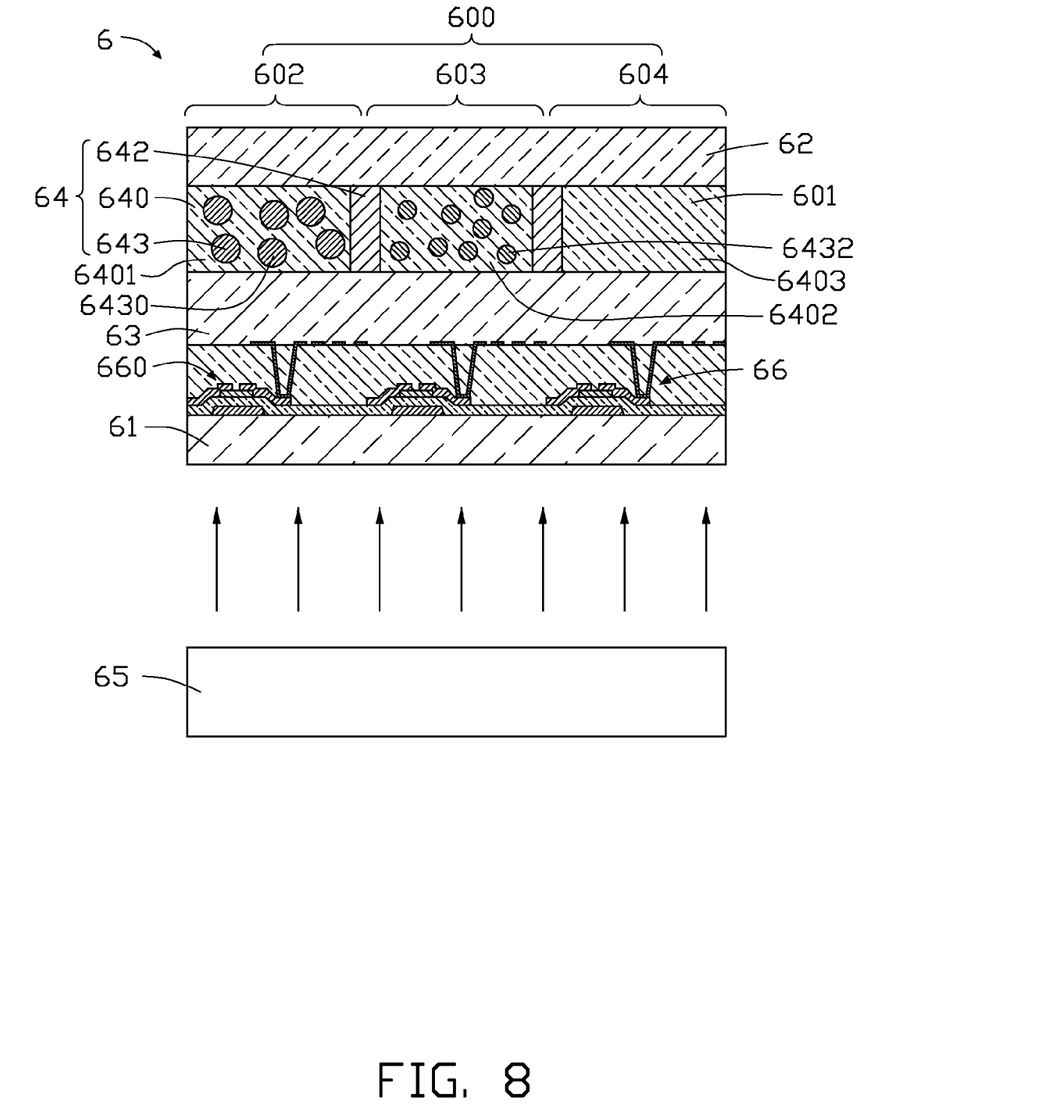
FIG. 8 is a cross-sectional view of the display panel of FIG. 7, taken along line VI-VI.

FIG. 7 illustrates an isometric view of a sixth embodiment of a display panel 6. FIG. 8 illustrates a cross-sectional view of the display panel 6 of FIG. 7, taken along line VIII-VIII. FIG. 8 merely illustrates one pixel area 600 for example. The display panel 6 displays a full color image. In this embodiment, the display panel 6 is an LCD panel.

The display panel 6 includes a first substrate 61, a second substrate 62 opposite to the first substrate 61, a liquid crystal layer 63 set between the first substrate 61 and the second substrate 63, a color filter 64 formed on the second substrate 63, and a backlight module 65 set below the first substrate 61 for emitting backlight to illuminate the display panel 6. The first substrate 61 is an array substrate with a thin film transistor (TFT) array 66 having a plurality of TFTs 660.

The color filter 64 defines a number of pixel areas 600. Each pixel area 600 includes a number of sub-pixels 601 for respectively converting the backlight to the light with different colors. Each TFT 660 of the TFT array 66 corresponding to one of the sub-pixels 601 controls the rotation of the liquid crystal molecules of the liquid crystal layer 63 in the sub-pixel 601 to adjust a light transmittance of the sub-pixel 601. In this embodiment, the display panel 6 employs three-primary color lights to display the full color image. The sub-pixels 601 can include a first sub-pixel 602, a second sub-pixel 603, and a third sub-pixel 604. The first sub-pixel 602 emits red light. The second sub-pixel 603 emits green light. The third sub-pixel 604 emits blue light. The backlight module 65 emits white backlight.

The color filter 64 includes a number of filtering parts 640 with different colors, a number of black matrixes 642, and a number of quantum dot particles 643 formed in the filtering parts 640. The filtering parts 640 with different colors are separated by the black matrixes 442 from each other and respectively corresponding to the sub-pixels 601 for respectively converting the backlight to the light with different colors.

In this embodiment, the color filter 64 includes a transparent first filtering part 6401 corresponding to the first sub-pixel 602, a green second filtering part 6402 corresponding to the second sub-pixel 603, a blue third filtering part 6403 corresponding to the third sub-pixel 604, a number of red quantum dot particles 6430 formed in the transparent first filtering part 6401, and a number of green quantum dot particles 6432 formed in the green second filtering part 6402. In at least one embodiment, no quantum dot particle 443 is formed in the blue third filtering part 6403.

Figure 9:
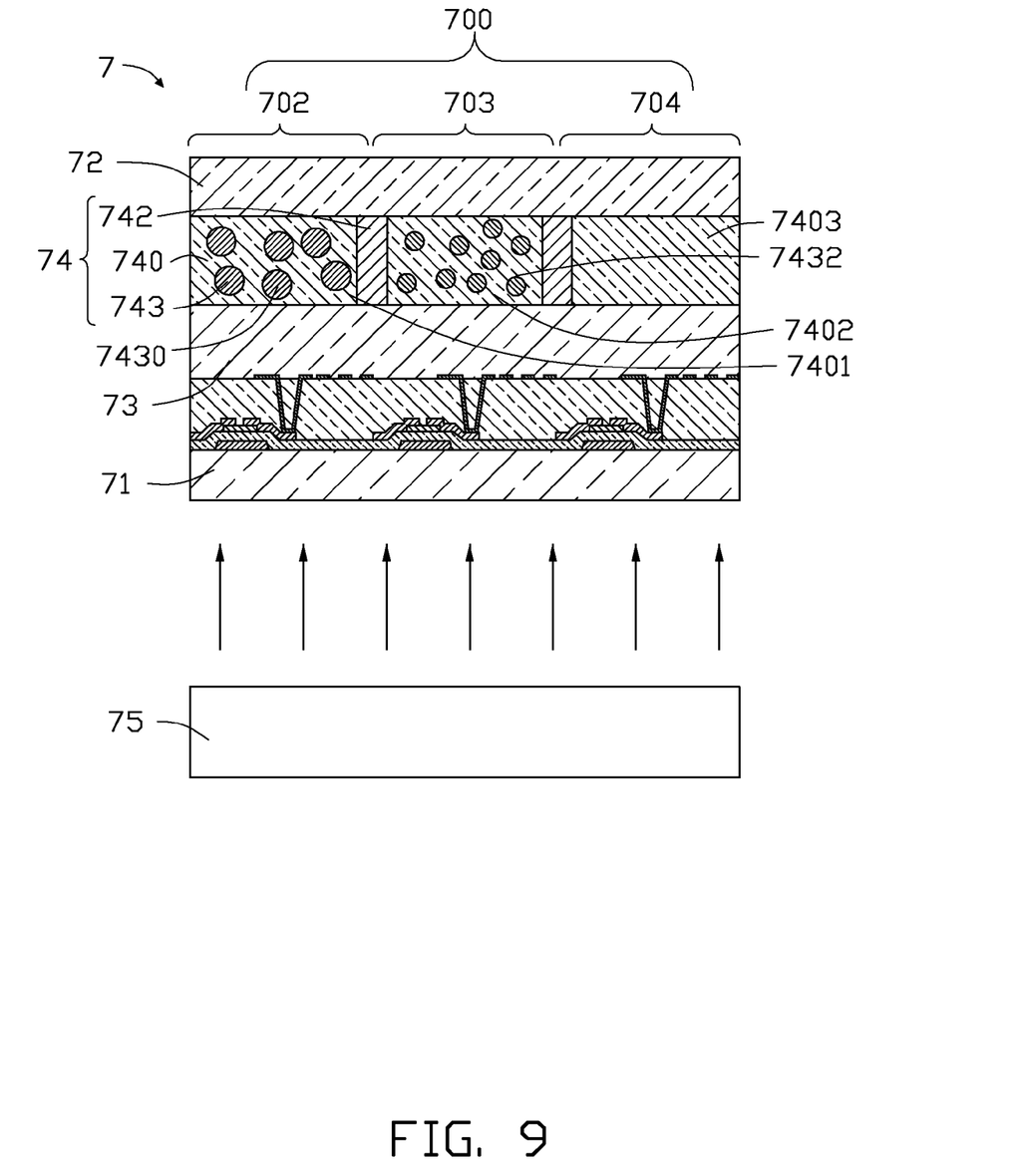
FIG. 9 is a cross-sectional view of a seventh embodiment of a display panel.

FIG. 9 illustrates a cross-sectional view of a seventh embodiment of a display panel 7. In this embodiment, the display panel 7 is an LCD panel. The display panel 7 includes a first substrate 71, a second substrate 72 opposite to the first substrate 71, a liquid crystal layer 73 set between the first substrate 71 and the second substrate 72, a color filter 74 formed on the second substrate 72, and a backlight module 75 set below the first substrate 71 for emitting a backlight.

The color filter 74 defines a number of pixel areas 700. Each pixel area 700 includes a number of sub-pixels 701 for respectively converting the backlight to the light with different colors. In this embodiment, the display panel 7 employs three-primary color lights to display the full color image. The sub-pixels 701 can include a first sub-pixel 702, a second sub-pixel 703, and a third sub-pixel 704. The first sub-pixel 702 emits red light. The second sub-pixel 703 emits green light. The third sub-pixel 704 emits blue light. The backlight 75 emits blue backlight.

The color filter 74 includes a number of filtering parts 740 with different colors, a number of black matrixes 742, and a number of quantum dot particles 743 formed in the filtering parts 740. The filtering parts 740 with different colors are separated from each other by the black matrixes 742 and respectively correspond to the sub-pixels 701 respectively converting the backlight to the light with different colors.

In this embodiment, the color filter 74 includes a transparent first filtering part 7401 corresponding to the first sub-pixel 702, a transparent second filtering part 7402 corresponding to the second sub-pixel 703, a transparent third filtering part 7403 corresponding to the third sub-pixel 704, a number of red quantum dot particles 7430 formed in the transparent first filtering part 7401, and a number of green quantum dot particles 7432 formed in the transparent second filtering part 7402. In at least one embodiment, no quantum dot particles 743 are formed in the transparent third filtering part 7403.

Figure 10:
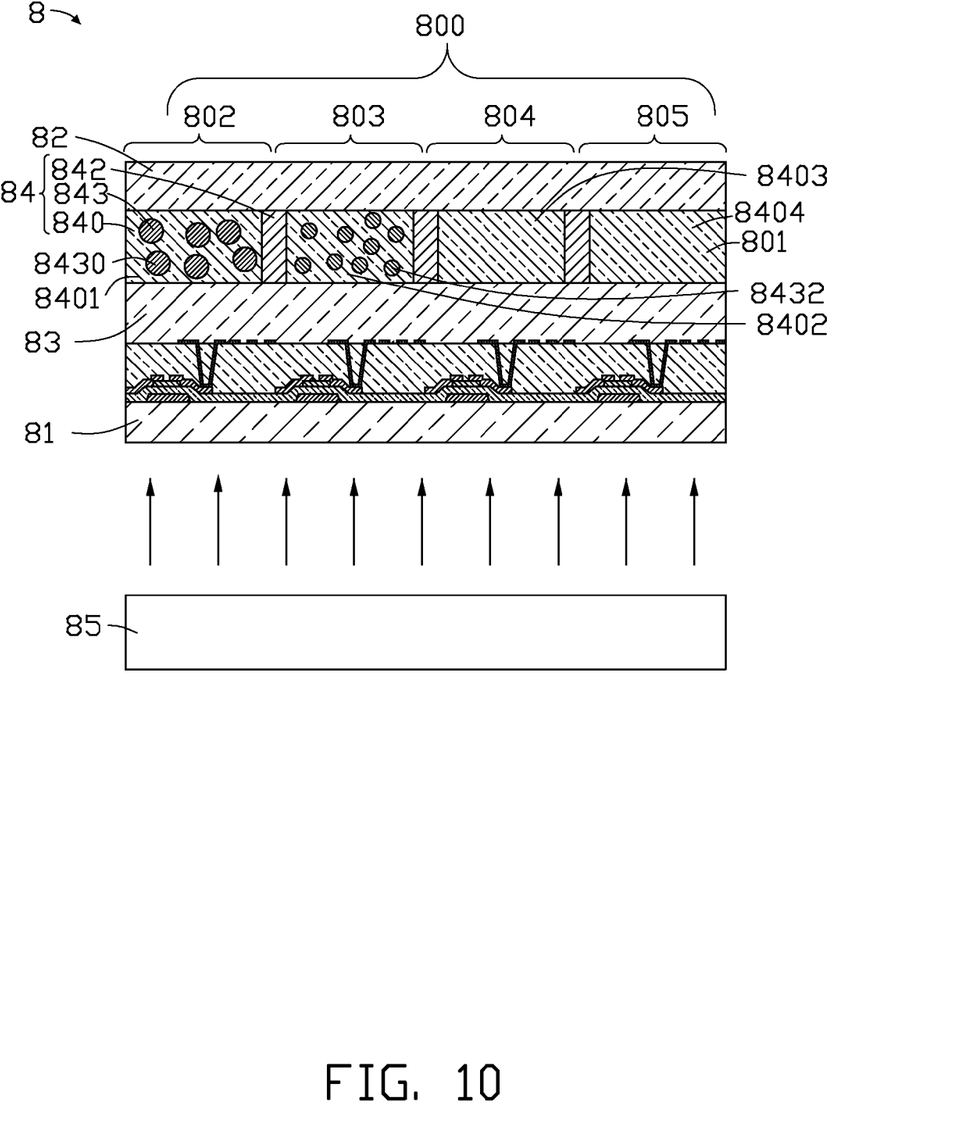
FIG. 10 is a cross-sectional view of an eighth embodiment of a display panel.

FIG. 10 illustrates a cross-sectional view of an eighth embodiment of a display panel 8. In this embodiment, the display panel 8 is an LCD panel. The display panel 8 includes a first substrate 81, a second substrate 82 opposite to the first substrate 81, a liquid crystal layer 83 set between the first substrate 81 and the second substrate 82, a color filter 84 formed on the first substrate 81, and a backlight module 85 set below the first substrate 81 for emitting backlight.

The color filter 84 defines a number of pixel areas 800. Each pixel area 800 includes a number of sub-pixels 801 for respectively converting the backlight to the light with different colors. In this embodiment, the display panel 8 employs three-primary color lights to display the full color image. The sub-pixels 801 can include a first sub-pixel 802, a second sub-pixel 803, a third sub-pixel 804, and a fourth sub-pixel 805. The first sub-pixel 802 emits red light. The second sub-pixel 803 emits green light. The third sub-pixel 804 emits blue light. The fourth sub-pixel 805 emits white light to increase a brightness of the pixel area 800. The backlight 85 emits white backlight.

The color filter 84 includes a number of filtering parts 840 with different colors, a number of black matrixes 842, and a number of quantum dot particles 843 formed in the filtering parts 840. The filtering parts 840 with different colors are divided by the black matrix 842 and respectively correspond to the sub-pixels 801 for respectively converting the backlight to the light with different colors.

In this embodiment, the color filter 84 includes a transparent first filtering part 8401 corresponding to the first sub-pixel 802, a green second filtering part 8402 corresponding to the second sub-pixel 803, a blue third filtering part 8403 corresponding to the third sub-pixel 804, a transparent fourth filtering part 8404 corresponding to the fourth sub-pixel 805, a number of red quantum dot particles 8430 formed in the transparent first filtering part 8401, and a number of green quantum dot particles 8432 formed in the green second filtering part 8402. In at least one embodiment, no quantum dot particle 843 is formed in both the blue third filtering part 8403 and the transparent fourth filtering part 8404. The white backlight passes through the transparent fourth filtering part 8404 without any color conversion.

It is believed that the present embodiments and their advantages will be understood from the foregoing description, and it will be apparent that various changes may be made thereto without departing from the scope of the disclosure or sacrificing all of its material advantages.

What is claimed is:

1. A display panel comprising:
    a lighting device configured to emit dual band white backlight comprising blue and green band light and yellow band light; and
    a color filter configured to convert the dual band white backlight to light composed of three-primary colors, the color filter comprising a plurality of first filtering parts having a green color, a plurality of second filtering parts having a blue color, and a plurality of quantum dot blocks, the first filtering parts being made of a photoresist material comprising dye with green color; the first filtering parts being configured to selectively allow light having a green color to pass therethrough; the second filtering parts being made of a photoresist material comprising dye with blue color; the second filtering parts being configured to selectively allow light having a blue color to pass therethrough; the quantum dot blocks being red quantum dot blocks; and the quantum dot blocks being configured to convert a part of green light of the dual band white backlight to red light.

2. The display panel of claim 1, wherein the color filter further comprises a plurality of black matrixes; the first filtering parts, the second filtering parts, and the quantum dot blocks are separated from each other by the black matrixes.

3. A display panel comprising:
    a lighting device configured to emit dual band white backlight comprising blue band light and red band light; and
    a color filter configured to convert the dual band white backlight to light composed of three-primary colors, the color filter comprising a plurality of first filtering parts having a red color, a plurality of second filtering parts having a blue color, and a plurality of quantum dot blocks, the first filtering parts being made of a photoresist material comprising dye with red color; the first filtering parts being configured to selectively allow light having a red color to pass therethrough; the second filtering parts being made of a photoresist material comprising dye with blue color; the second filtering parts being configured to selectively allow light having a blue color to pass therethrough; the quantum dot blocks being green quantum dot blocks; and the quantum dot blocks being configured to convert a part of blue light of the dual band white backlight to green light.

4. The display panel of claim 3, wherein the color filter further comprises a plurality of black matrixes; the first filtering parts, the second filtering parts, and the quantum dot blocks are separated from each other by the black matrixes.

5. A color filter of display panel for converting dual band white backlight comprising blue and green band light and yellow band light to light with three-primary colors, comprising:
    a plurality of first filtering parts having a green color, the first filtering parts being made of a photoresist material comprising dye with green color, the first filtering parts configured to selectively allow light having a green color to pass therethrough;
    a plurality of second filtering parts having a blue color, the second filtering parts being made of a photoresist material comprising dye with blue color, the second filtering parts configured to selectively allow light having a blue color to pass therethrough; and
    a plurality of quantum dot blocks being red quantum dot blocks, the quantum dot blocks converting a part of green light of the dual band white backlight to red light.

6. The color filter of claim 5, wherein the color filter further comprises a plurality of black matrixes; the first filtering parts, the second filtering parts, and the quantum dot blocks are separated from each other by the black matrixes.

7. A color filter of display panel for converting dual band white backlight comprising blue band light and red band light to light with three-primary colors, comprising:
    a plurality of first filtering parts having a red color, the first filtering parts being made of a photoresist material comprising dye with red color, the first filtering parts configured to selectively allow light having a red color to pass therethrough;
    a plurality of second filtering parts having a blue color, the second filtering parts being made of a photoresist material comprising dye with blue color, the second filtering parts configured to selectively allow light having a blue color to pass therethrough; and
    a plurality of quantum dot blocks being green quantum dot blocks, the quantum dot blocks converting a part of blue light of the dual band white backlight to green light.

8. The color filter of claim 7, wherein the color filter further comprises a plurality of black matrixes; the first filtering parts, the second filtering parts, and the quantum dot blocks are separated from each other by the black matrixes.

* * * * *